United States Patent [19]

Nakamura et al.

[11] 4,178,526

[45] Dec. 11, 1979

[54] PIEZOELECTRICALLY DRIVEN TUNING FORK RESONATOR AND MOUNTING STRUCTURE

[75] Inventors: Takeshi Nakamura, Uji; Hiroshi Nishiyama, Muko; Yoshimasa Yamashita, Kameoka; Yoshiko Kitayama, Nagaokakyo, all of Japan

[73] Assignee: Murata Manufacturing Co., Ltd., Kyoto, Japan

[21] Appl. No.: 902,819

[22] Filed: May 4, 1978

[30] Foreign Application Priority Data

May 9, 1977 [JP] Japan .......................... 52/59328[U]

[51] Int. Cl.² .......................................... H01L 41/10
[52] U.S. Cl. ................................. 310/321; 310/326; 310/351; 310/25
[58] Field of Search ............... 310/321, 326, 345, 370, 310/348, 351, 353, 25; 333/71, 72; 58/23 TF, 23 U

[56] References Cited

U.S. PATENT DOCUMENTS

| 3,354,413 | 11/1967 | Ko ..................................... 310/321 X |
| 3,697,789 | 10/1972 | Kato et al. ......................... 310/345 X |
| 3,984,790 | 10/1976 | Tanaka .............................. 310/321 X |
| 4,004,166 | 1/1977 | Nakata .............................. 310/312 |
| 4,037,179 | 7/1977 | Terayama ........................ 310/348 X |

FOREIGN PATENT DOCUMENTS 1425435 2/1976 United Kingdom ..................... 310/370

Primary Examiner—Mark O. Budd
Attorney, Agent, or Firm—Wenderoth, Lind & Ponack

[57] ABSTRACT

A tuning fork resonator which has a substantially U-shaped tuning fork supported in spaced relation to a support base by means of a support system with at least three support points. The three-point support system includes a pair of support rods holding the tuning fork therebetween and at least one electrode terminal pin supporting the tuning fork at one end face thereof. A piezoelectric transducer element provided for at least one of the opposed tines of the tuning fork is electrically connected to the terminal pin by means of an electro-conductive elastic deposit of a bonding agent. An electrically insulating and shock and vibration absorbing layer is provided between the bottom of the tuning fork and the end face of the terminal pin which is held in contact therewith.

5 Claims, 3 Drawing Figures

PIEZOELECTRICALLY DRIVEN TUNING FORK RESONATOR AND MOUNTING STRUCTURE

BACKGROUND OF THE INVENTION

The present invention generally relates to a tuning fork resonator and, more particularly, to a support structure for an electrically driven tuning fork of the tuning fork resonator.

A tuning fork resonator is well known as comprising an electrically driven tuning fork including a pair of opposed fork tines connected at one end to each other by means of a common junction portion, and a support base for supporting the tuning fork in position spaced therefrom. A tuning fork resonator is commonly used as a highly selective filter for electrical signals or in conjunction with a feedback amplifier to provide a very stable oscillator.

For the purpose the discussion of the present invention, the prior art tuning fork resonator which appears to be closest to the present invention will now be described with reference to FIG. 1 of the accompanying drawings which illustrates the prior art tuning fork resonator in a schematic perspective view.

Referring now to FIG. 1, the prior art tuning fork resonator comprises a substantially U-shaped tuning fork 10 of metallic material including a pair of spaced opposed tines 11 and 12 and a common junction portion 13 integrally connected at its opposed ends with respective ends of the tines 11 and 12, the space between the opposed tines 11 and 12 forming a substantially U-shaped groove 14. This tuning fork resonator further comprises a support structure including a support base 15 of electrically insulating material and a pair of spaced support rods 16 and 17 rigidly mounted on and upwardly extending from one surface of the support base 15, the respective free ends of said support rods 16 and 17 cooperating with each other to support a portion of the tuning fork 10 intermediate the nodes of fundamental harmonic oscillation thereof, that is, a portion intermediate of the length of the common junction portion 13. The support base 15 carries a pair of electrode terminal pins 18 and 19 each having the opposite ends thereof situated on respective sides of the support base 15, a substantially intermediate portion thereof extending completely through the thickness of the support base 15. The ends of the respective terminal pins 18 and 19 adjacent the tuning fork 10 are electrically connected by means of lead wires 20 and 21 respectively to piezoelectric elements (only one of which is shown by 22) each being applied to an outer surface of the corresponding tine 11 or 12 which is remote from the other tine 12 or 11.

Where the tuning fork resonator of the construction described above and shown in FIG. 1 is to be used as an oscillator, one of the terminal pins, for example, the terminal pin 18, is electrically connected to the other terminal pin 19 through a feedback amplifier (not shown) so that an electric signal indicative of the frequency of intrinsic vibration of the tuning fork 10 can be, after having been supplied from the piezoelectric element, connected to the terminal pin 18 through the lead wire 20, to the feedback amplifier and then amplified by said feedback amplifier, supplied back to the piezoelectric element 22 to keep the tuning fork 10 vibrating at the intrinsic frequency.

The support structure employed in the prior art tuning fork resonator shown in FIG. 1 may be referred to as a two-point support system and, because of the two-point support for the tuning fork 10, the tuning fork resonator as a whole does not have sufficient resistance to shock and vibration. By way of example, once a shock or vibration is applied, either directly or indirectly, to one or both of the tuning fork 10 and the support base 15, the resonance frequency tends to vary and/or the tuning fork 10 tends to be shortcircuited with one of the terminal pins 18 and 19 or lead wires 20 and 21.

Furthermore, with the support structure shown in FIG. 1, because of the employment of the lead wires 20 and 21, the manufacture of the tuning fork resonator is complicated in that soldering at four points is required.

On the other hand, in order to avoid the above disadvantages, the tuning fork 10 might be placed directly on the support base 15. This possibility, however, has the drawback that, since the area of contact of the tuning fork 10 with the support base 15 becomes relatively large, the Q of the tuning fork resonator tends to be reduced.

SUMMARY OF THE INVENTION

Accordingly, the present invention has been developed with a view to substantially eliminating the above described disadvantages and inconveniences inherent in the prior art tuning fork resonator and is intended to provide an improved tuning fork resonator having a relatively high resistance to shock and vibration.

Another object of the present invention is to provide an improved tuning fork resonator wherein the tuning fork is supported steadily by a support system having at least three-point support supporting the tuning fork at at least three points thereby providing greater immunity from shock and vibration.

A further object of the present invention is to provide an improved tuning fork resonator which can readily be assembled with substantially no complicated soldering procedure required.

The tuning fork resonator herein disclosed comprises a substantially U-shaped tuning fork of metallic material including a pair of opposed tines and a common junction portion integrally connected at its opposite ends with respective ends of the fork tines, a support base of electrically insulating material, a pair of spaced support rods rigidly mounted on the support base, and at least one terminal pin completely extending through the thickness of the support base. The tuning fork is supported by the support rods in such a manner that the free ends of the respective support rods support the common junction portion with a bottom surface of the common junction portion, which is opposite to the surface thereof from which the tines project outwardly, held in spaced relation to the surface of the support base.

While the construction of the tuning fork resonator described thus far is substantially identical with that of the prior art tuning fork resonator described with reference to and shown in FIG. 1, the present invention has the features that the tuning fork is mounted on the terminal pin with the bottom surface of the common junction portion held in contact with an end face of the terminal pin through an elastic insulating layer. In addition thereto, the present invention also has the feature that electrical connection between at least one piezoelectric transducer element, which is applied to a side portion of one of the fork tines adjacent the common junction portion, and the terminal pin is by means of an elastic electroconductive deposit of bonding agent which serves not only to establish such electric connection therebetween, but also to firmly retain the tuning fork in position.

With the construction according to the present invention, there is provided a support system with at least three-point support for the support of the tuning fork relative to the support base. Because of this and in view of the fact that the tuning fork is retained in position by the elastic electroconductive deposit of bonding agent, not only does the tuning fork resonator have a greater immunity from shock and vibration, but also the possibility of change in resonance frequency which may otherwise result from the application of shock and/or vibration to the tuning fork resonator is substantially eliminated.

In addition, the employment of the elastic insulating layer does not result in lowering the Q of the resonator, such as is the case where the tuning fork is directly placed on the support base, even though the tuning fork is mounted on the end face of the terminal pin, since the elastic insulating layer has a relatively small thickness and tends to absorb vibrations. This elastic insulating layer also serves to electrically insulate the terminal pin from the tuning fork and, therefore, the possibility of shortcircuiting of any one of the terminal pins with the tuning fork can advantageously be eliminated.

BRIEF DESCRIPTION OF THE DRAWINGS

These and other objects and features of the present invention will become apparent from the following description taken in conjunction with a preferred embodiment thereof with reference to the accompanying drawings, in which.

DETAILED DESCRIPTION OF THE INVENTION

Figure 2:
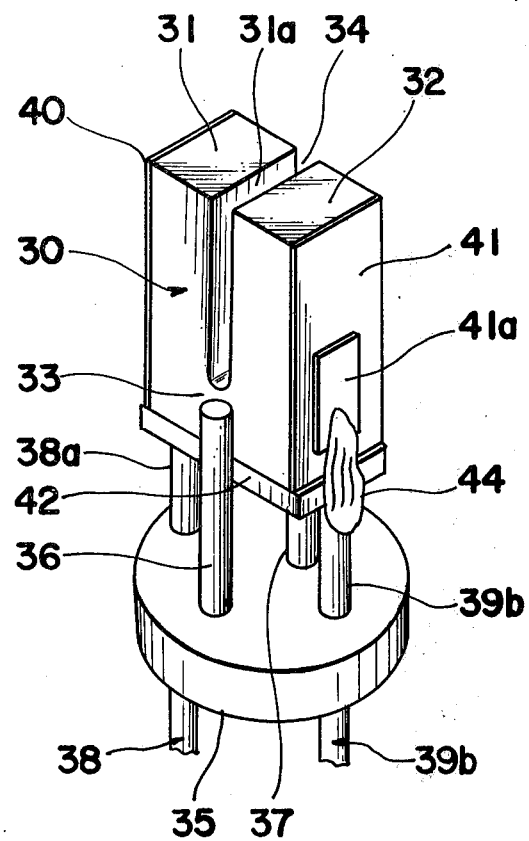
FIG. 2 is a schematic perspective view of an improved tuning fork resonator according to the present invention.
Figure 3:
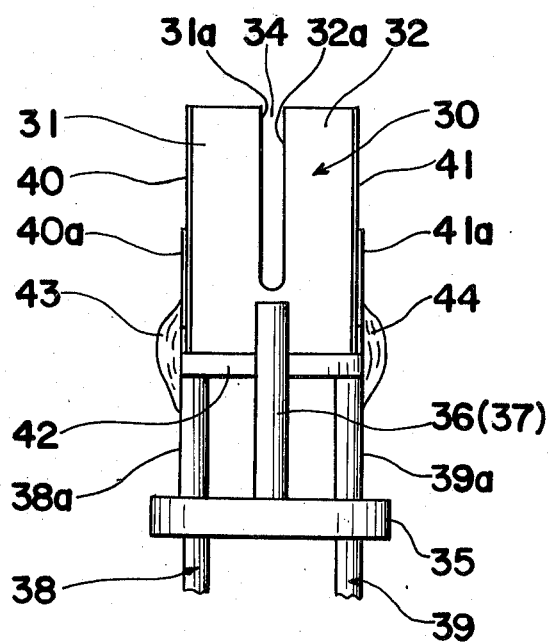
FIG. 3 is a side view of the improved tuning fork resonator shown in FIG. 1.

Referring to FIGS. 2 and 3 wherein a tuning fork resonator embodying the present invention is shown, the tuning fork resonator comprises a substantially U-shaped tuning fork 30 of metallic material including a pair of opposed tines 31 and 32 and a common junction portion 33 connected at its opposite ends integrally with respective ends of the tines 31 and 32. A space which is defined between inner surfaces 31a and 32a of the respective tines 31 and 32 facing towards each other is formed into a substantially U-shaped groove 34.

As is the case with the prior art tuning fork resonator shown in FIG. 1, the tuning fork 30 is supported relative to a supporting base 35 by means of a pair of spaced support rods 36 and 37 extending outwardly from one surface of the supporting base 35 and terminating in contact with respective portions of the opposite side surfaces of the common junction portion 33 and below the bottom of the figure "U" of the groove 34, both of said opposite side surfaces of the common junction portion 33 lying at right angles to the plane of the inner surfaces 31a and 32a of the respective tines 31 and 32. Preferably, the point of contact of the free end portions of the respective support rods 36 and 37 with the corresponding portion of the side surface of the common junction portion 33 is aligned with the center of gravity of the tuning fork 30 or a node of vibration of the tuning fork 30. The tuning fork 30 thus supported is spaced a predetermined distance from the supporting base 35.

The supporting base 35 has a pair of spaced terminal pins 38 and 39 each having the opposite end portions situated on respective sides of the supporting base 35 and a substantially intermediate portion extending completely through the thickness of the supporting base 35. The end portion of both of the terminal pins 38 and 39 which extends outwardly from said one surface of the supporting base 35 in a direction parallel to the direction of protrusion of the support rods 36 and 37 has a height less than that of the support rods 36 and 37.

Figure 1:
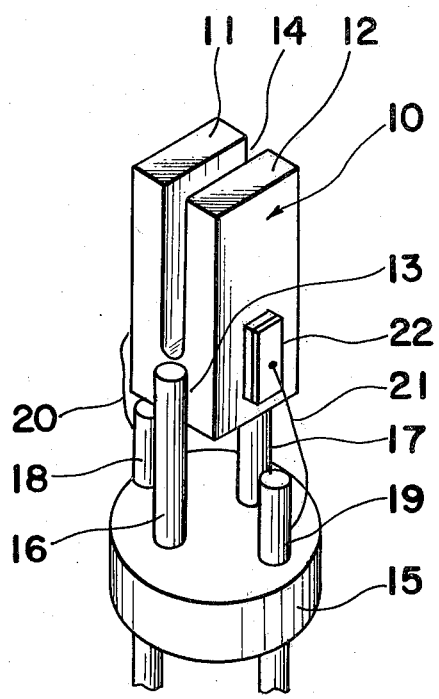
FIG. 1 is a schematic perspective view of the prior art tuning fork resonator, reference to which has already made.

The tuning fork 30 may have piezoelectric elements as shown at 22 in FIG. 1, attached to the tines in the manner as shown in FIG. 1. However, as illustrated in FIGS. 2 and 3, the outer surface of both of the tines 31 and 32, which is opposite to the corresponding inner surface 31a or 32a has applied over the entire surface thereof a piezoelectric transducer layer 40 or 41 of uniform thickness. These piezoelectric transducer layers 40 and 41 have respective rectangular electrode pieces 40a and 41a smaller in size than the surface area of the outer surfaces of the tines 31 and 32 affixed to the associated piezoelectric transducer layers 40 and 41 at respective positions substantially aligned with the bottom of the U-shaped groove 34, preferably, at respective positions which correspond to, or are in the vicinity of, nodes of vibration of the tuning fork 30.

The tuning fork 30 has an elastic insulating layer 42 of a substantially rectangular shape affixed to the bottom surface of the tuning fork 30. This elastic insulating layer 42 may be applied to the bottom surface of the tuning fork 30 by the use of a bonding agent or, alternatively, may be formed by depositing a material for the elastic insulating layer 42 by any known depositing technique, for example, printing a spattering technique. This elastic insulating layer 42 has a width substantially equal to the width of the bottom of the tuning fork 30 as measured in a direction parallel to the plane of the inner surfaces 31a and 32a while the length of the elastic insulating layer 42 is selected so as to be substantially equal to or slightly greater than the sum of the length of the bottom of the tuning fork 30, as measured in a direction perpendicular to the plane of the inner surfaces 31a and 32a, plus the sum of the thicknesses of the individual piezoelectric transducer layers 40 and 41 and electrode pieces 40a and 41a, so that the opposite end faces of the rectangular elastic insulating layer 42 are respectively aligned with the planes of the electrode pieces 40a and 41a. This elastic insulating layer 42 may be made of paper or a film of polyethylene glycol terephthalate such as commercially available under a trademark "Mylar" (owned by Du Pont). It is to be noted that the elastic insulating layer 42 has both electric insulating and shock and vibration absorbing properties.

The tuning fork 30 having the elastic insulating layer 42 affixed to the bottom surface thereof is, while held by the free end portions of the support rods 36 and 37 in the manner as hereinbefore described, mounted on the end portions 38a and 39a of the respective terminal pins 38 and 39 with their end faces contacting the elastic insulating layer 42 as best shown in FIG. 3.

With the tuning fork 30 thus mounted relative to the support base 35, the end portions 38a and 39a of the terminal pins 38 and 39 are respectively electrically connected to the electrode pieces 40a and 41a by means of electroconductive elastic deposits 43 and 44 formed by the application of a bonding agent. It is to be noted that, since both the piezoelectric transducer layers 40 and 41 are applied over the entire outer surface of the corresponding tine 31 or 32 as hereinbefore described, there is no possibility of the electroconductive elastic deposits 43 and 44 contacting the tuning fork 30 directly.

From the foregoing full description of the present invention, it is clear that the four-point support system is advantageous in that the tuning fork is steadily supported relative to the supporting base.

Although the present invention has fully been described in connection with the preferred embodiment thereof, it is to be noted that both the terminal pins 38 or 39 may not always be necessary in combination with the associated piezoelectric transducer layer 40 or 41, the associated electrode piece 40a or 41a and the associated electroconductive deposit 43 or 44 of bonding agent. In this case, the tuning fork 30 can be supported by the three-point support system.

Other changes and modifications will also be apparent to those skilled in the art. Accordingly, such changes and modifications are to be understood as included within the true scope of the present invention unless they depart therefrom.

We claim:

1. A tuning fork resonator which comprises:
   an electrically driven metallic tuning fork having a pair of spaced opposed tines and a common junction portion integrally connected at opposite ends with respective ends of the tines, said tuning fork further having a substantially U-shaped groove defined between the opposed tines;
   an elastic insulating layer having electrically insulating and shock and vibration absorbing properties on the tuning fork;
   at least one piezoelectric transducer layer applied to at least a portion of the surface of one of the tines which is remote from the U-shaped groove and extending to and contacting said insulating layer;
   an electrode applied to the external surface of said transducer layer;
   a support base;
   a pair of support rods extending outwardly from the support base and supporting said tuning fork on the free end thereof;
   at least one electrode terminal pin having the opposite end portions thereof on the opposite sides of said support base and a substantially intermediate portion extending completely through the thickness of said support base, the end portion of said terminal pin on the side of said support base on which said tuning fork is positioned engaging said elastic layer and supporting said tuning fork therethrough; and
   a deposit of an electroconductive bonding agent connecting said electrode to said terminal pin and extending across the position where the transducer layer and the insulating layer are in contact, whereby the bonding agent is kept out of electrical contact with the metallic tuning fork.

2. A tuning fork resonator as claimed in claim 1 in which said piezoelectric transducer layer covers the entire surface of said one surface of the tine.

3. A tuning fork resonator as claimed in claim 1 wherein said elastic insulating layer is applied to the surface of the tuning fork which faces toward said support base, and said tuning fork is supported on the transverse end surface of said terminal pin.

4. A tuning fork resonator as claimed in claim 3 in which the tines of said tuning fork extend perpendicularly away from said support base, and said elastic insulating layer is on the side of said common junction portion toward said support base, said terminal pin engaging said elastic insulating layer at the end adjacent the surface of the tine on which said transducer layer is located, said bonding agent extending over the end edge of said insulating layer into contact with said terminal pin.

5. A tuning fork resonator as claimed in claim 1 further comprising:
   a further piezoelectric transducer layer applied to at least a portion of the surface of the other of said tines which is remote from the U-shaped groove and extending to and contacting said insulating layer;
   a further electrode applied to the external surface of said further transducer layer;
   a further electrode terminal pin having the opposite end portions thereof on the opposite sides of said support base and a substantially intermediate portion extending completely through the thickness of said support base, the end portion of said further terminal pin on the side of said support base on which said tuning fork is positioned engaging said elastic layer and supporting said tuning fork therethrough; and
   a further deposit of an electroconductive bonding agent connecting said further electrode to said further terminal pin and extending across the position where said further transducer layer and the insulating layer are in contact.

* * * * *